(12) United States Patent
Chang

(10) Patent No.: US 10,990,781 B2
(45) Date of Patent: Apr. 27, 2021

(54) EXPOSURE METHOD, ELECTRONIC DEVICE AND MASTER-SLAVE SYSTEM

(71) Applicant: Guangzhou Tyrafos Semiconductor Technologies Co., LTD, Guangzhou (CN)

(72) Inventor: Keng-Li Chang, Taipei (TW)

(73) Assignee: GUANGZHOU TYRAFOS SEMICONDUCTOR TECHNOLOGIES CO., LTD, Guangzhou (CN)

(*) Notice: Subject to any disclaimer, the term of this patent is extended or adjusted under 35 U.S.C. 154(b) by 57 days.

(21) Appl. No.: 16/264,706

(22) Filed: Feb. 1, 2019

(65) Prior Publication Data
US 2020/0045216 A1    Feb. 6, 2020

(30) Foreign Application Priority Data

Jul. 31, 2018   (TW) .................................. 107126454

(51) Int. Cl.
*G06K 9/00* (2006.01)
*G02B 27/30* (2006.01)
(Continued)

(52) U.S. Cl.
CPC ......... *G06K 9/00013* (2013.01); *G02B 1/041* (2013.01); *G02B 3/0006* (2013.01); *G02B 27/0944* (2013.01); *G02B 27/30* (2013.01); *G02B 27/4233* (2013.01); *G03F 7/20* (2013.01); *G06F 13/20* (2013.01); *G06F 13/4282* (2013.01); *G06K 9/0004* (2013.01);
(Continued)

(58) Field of Classification Search
None
See application file for complete search history.

(56) References Cited

U.S. PATENT DOCUMENTS 7,265,784 B1 *   9/2007   Frank .................... H04N 5/2351
                                                    348/222.1
7,483,058 B1 *   1/2009   Frank .................... H04N 5/232
                                                    348/222.1
(Continued)

FOREIGN PATENT DOCUMENTS

CN          105991935          10/2016

OTHER PUBLICATIONS

"Office Action of Taiwan Counterpart Application," dated Apr. 30, 2019, p. 1-p. 5.

*Primary Examiner* — Cynthia Segura
(74) *Attorney, Agent, or Firm* — JCIPRNET

(57) ABSTRACT

An exposure method, an electronic device and a master-slave system are provided. The electronic device includes an image capturing circuit and a processor coupled to the image capturing circuit. The processor obtains an exposure command and a first quantity, controls the image capturing circuit to perform an exposure operation to capture an image according to the exposure command, and determines whether a quantity of the image reaches the first quantity. When the quantity of the image does not reach the first quantity, the processor performs the operation of controlling the image capturing circuit to perform the exposure operation to capture the image again. When the quantity of the image reaches the first quantity, the processor stops controlling the image capturing circuit to perform the exposure operation.

8 Claims, 5 Drawing Sheets

(51) Int. Cl.
| | |
|---|---|
| G02B 1/04 | (2006.01) |
| G02B 3/00 | (2006.01) |
| G02B 27/09 | (2006.01) |
| G02B 27/42 | (2006.01) |
| G03F 7/20 | (2006.01) |
| H01L 27/146 | (2006.01) |
| H04N 5/232 | (2006.01) |
| G06F 13/42 | (2006.01) |
| H04N 1/00 | (2006.01) |
| G06F 13/20 | (2006.01) |
| G09G 3/3225 | (2016.01) |
| H04N 1/21 | (2006.01) |
| H04N 5/235 | (2006.01) |
| G11C 11/412 | (2006.01) |
| G11C 11/419 | (2006.01) |
| H01L 27/11 | (2006.01) |
| H04N 5/353 | (2011.01) |
| H04N 5/355 | (2011.01) |
| H04N 5/3745 | (2011.01) |
| H04N 5/378 | (2011.01) |
| H01L 23/00 | (2006.01) |
| H04L 29/08 | (2006.01) |

(52) U.S. Cl.
CPC .......... G09G 3/3225 (2013.01); G11C 11/412 (2013.01); G11C 11/419 (2013.01); H01L 24/48 (2013.01); H01L 27/1104 (2013.01); H01L 27/14601 (2013.01); H01L 27/14605 (2013.01); H01L 27/14609 (2013.01); H01L 27/14643 (2013.01); H01L 27/14685 (2013.01); H04N 1/00214 (2013.01); H04N 1/2137 (2013.01); H04N 5/2351 (2013.01); H04N 5/2352 (2013.01); H04N 5/2353 (2013.01); H04N 5/2356 (2013.01); H04N 5/232061 (2018.08); H04N 5/3535 (2013.01); H04N 5/35509 (2013.01); H04N 5/35536 (2013.01); H04N 5/35554 (2013.01); H04N 5/35581 (2013.01); H04N 5/378 (2013.01); H04N 5/37452 (2013.01); H04N 5/37455 (2013.01); *G06F 2213/0002* (2013.01); *G09G 2320/064* (2013.01); *G09G 2354/00* (2013.01); *H01L 2224/48091* (2013.01); *H04L 67/10* (2013.01); *H04N 2201/0084* (2013.01)

(56) References Cited

U.S. PATENT DOCUMENTS

| | | | |
|---|---|---|---|
| 2009/0103380 A1* | 4/2009 | Pekny | G06F 3/0679 |
| | | | 365/201 |
| 2016/0203099 A1* | 7/2016 | Kim | G06F 13/4282 |
| | | | 710/105 |
| 2016/0255263 A1* | 9/2016 | Tanaka | H04N 5/2356 |
| | | | 348/230.1 |
| 2017/0216843 A1* | 8/2017 | Filipe Pinto Silva | G01B 11/26 |
| 2019/0191139 A1* | 6/2019 | Kaneko | H04N 5/247 |
| 2019/0253629 A1* | 8/2019 | Kim | H04N 5/23245 |
| 2019/0273878 A1* | 9/2019 | Minami | H04N 5/2353 |

* cited by examiner

EXPOSURE METHOD, ELECTRONIC DEVICE AND MASTER-SLAVE SYSTEM

CROSS-REFERENCE TO RELATED APPLICATION

This application claims the priority benefit of Taiwan application serial no. 107126454, filed on Jul. 31, 2018. The entirety of the above-mentioned patent application is hereby incorporated by reference herein and made a part of this specification.

BACKGROUND OF THE INVENTION

1. Field of the Invention

The invention relates to an exposure method, an electronic device and a master-slave system.

2. Description of Related Art

In general, when an image sensor (or an image capture circuit) is used in a camera in conventional art, if the user wishes to view the image captured by the camera in real time, the image sensor in the camera needs to be continuously exposed and maintained at a certain frame per second (fps). However, in applications that are not to be viewed by human eyes (e.g., fingerprint recognition, fingerprint detection, etc.), a continuous and stable frame rate is not a necessary condition. In this case, the image sensor being continuously exposed may cause unnecessary power consumption of the device.

SUMMARY OF THE INVENTION

The invention provides an exposure method, an electronic device and a master-slave system, which can effectively control the timing for the exposure operation of the image capturing circuit, so as to prevent capturing too many images due to unnecessary exposure operation and effectively reduce the power consumption of the device.

The invention proposes an electronic device, and the electronic device includes an image capturing circuit and a processor coupled to the image capturing circuit. The processor obtains an exposure command and a first quantity, controls the image capturing circuit to perform an exposure operation to capture an image according to the exposure command, and determines whether a quantity of the image reaches the first quantity. When the quantity of the image does not reach the first quantity, the processor performs the operation of controlling the image capturing circuit to perform the exposure operation to capture the image again. When the quantity of the image reaches the first quantity, the processor stops controlling the image capturing circuit to perform the exposure operation.

The invention proposes an exposure method for an electronic device. The electronic device includes an image capturing circuit and a processor, and the method includes: obtaining an exposure command and a first quantity by the processor; controlling, by the processor, the image capturing circuit to perform an exposure operation to capture an image according to the exposure command; determining whether a quantity of the image reaches the first quantity by the processor; when the quantity of the image does not reach the first quantity, performing, by the processor, the step of controlling the image capturing circuit to perform the exposure operation to capture the image again; and when the quantity of the image reaches the first quantity, stopping, by the processor, controlling the image capturing circuit to perform the exposure operation.

The invention proposes a master-slave system, which includes a master device and a slave device. The master device has a first interface. The slave device has a second interface and an image capturing circuit. The second interface is electrically connected to the first interface. The slave device controls the image capturing circuit to perform an exposure operation to capture a plurality of images. The master device provides a read command and a selection signal to the slave device. The slave device provides at least one first image among the plurality of images to the master device according to the read command and the selection signal. In the operation of providing the at least one first image among the plurality of images to the master device, when the slave device stops receiving the selection signal, the slave device stops performing the operation of controlling the image capturing circuit to perform the exposure operation to capture the plurality of images and stops performing the operation of providing the at least one first image among the plurality of images to the master device.

The invention proposes an exposure method for a master-slave system. The master-slave system includes a master device and a slave device. The master device having a first interface. The slave device has a second interface and an image capturing circuit. The second interface is electrically connected to the first interface. The method includes: controlling, by the slave device, the image capturing circuit to perform an exposure operation to capture a plurality of images; providing a read command and a selection signal to the slave device by the master device; providing at least one first image among the plurality of images to the master device by the slave device according to the read command and the selection signal; and in the step of providing the at least one first image among the plurality of images to the master device, when the slave device stops receiving the selection signal, stopping performing the step of controlling the image capturing circuit to perform the exposure operation to capture the plurality of images and stopping performing the step of providing the at least one first image among the plurality of images to the master device by the salve device.

Based on the above, the exposure method, the electronic device and the master-slave system of the invention can effectively control the timing for the exposure operation of the image capturing circuit, so as to prevent capturing too many images due to unnecessary exposure operation and effectively reduce the power consumption of the device.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
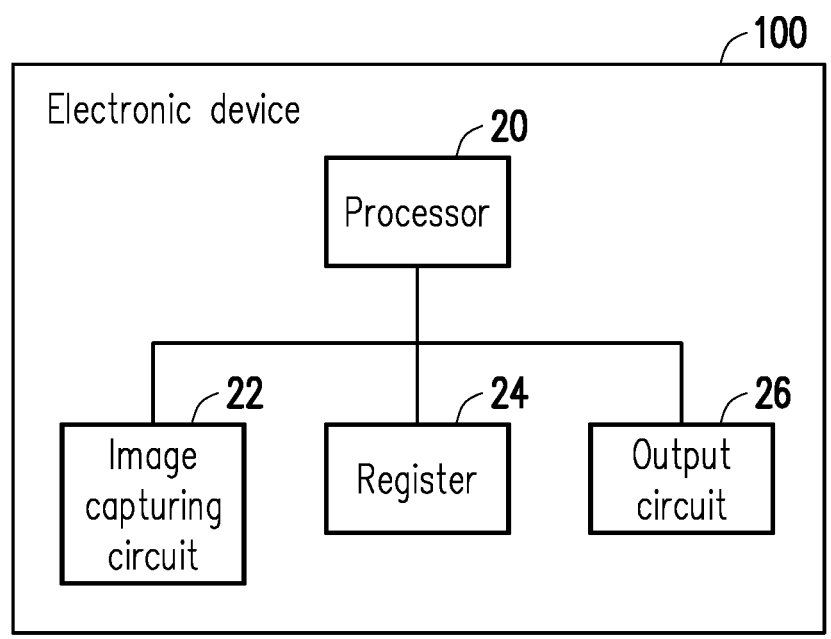
FIG. 1 is a schematic diagram illustrating an electronic device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Descriptions of the invention are given with reference to the exemplary embodiments illustrated with accompanied drawings, in which same or similar parts are denoted with same reference numerals. In addition, whenever possible, identical or similar reference numbers stand for identical or similar elements in the figures and the embodiments.

The exposure method of the invention is described below with reference to various embodiments.

First Embodiment

FIG. 1 is a schematic diagram illustrating an electronic device according to an embodiment of the invention.

With reference to FIG. 1, an electronic device 100 includes a processor 20, an image capturing circuit 22, a register 24 and an output circuit 26. Among them, the image capturing circuit 22, the register 24 and the output circuit 26 are respectively coupled to the processor 20. The electronic device 100 is, for example, an electronic device, such as a cell phone, a tablet computer or a notebook computer, but not limited thereto.

The processor 20 may be a central processing unit (CPU) or other programmable devices for general purpose or special purpose such as a microprocessor and a digital signal processor (DSP), a programmable controller, an application specific integrated circuit (ASIC) or other similar devices or a combination of above-mentioned devices.

The image capturing circuit 22 is configured to capture one or more images. For instance, the image capturing circuit 22 may be a camera lens having a charge coupled device (CCD), a complementary metal-oxide semiconductor (CMOS) device or other photosensitive devices, and may be used to perform an exposure operation and capture at least one image.

The register 24 may be a fixed or a movable device in any possible forms including a random access memory (RAM), a read-only memory (ROM), a flash memory or other similar devices, or a combination of the above-mentioned devices.

The output circuit 26 is mainly used to output the image captured by the image capturing circuit 22. The output circuit 26 is, for example, a transmission interface for transmitting data to other electronic devices or a display device for displaying the image captured by the image capturing circuit 22, but not limited thereto.

In this exemplary embodiment, the electronic device 100 further includes a storage circuit (not illustrated). The storage circuit of the electronic device 100 is stored with a plurality of program code segments. After being installed, the program code segments will be executed by the processor 20. For example, the storage circuit of the electronic device 100 includes a plurality of modules, and operations of the electronic device 100 are respectively executed by these modules. Here, each of the modules is composed of one or more program code segments. However, the invention is not limited in this regard. Each operation of the electronic device 100 may also be implemented in other hardware manners.

Figure 2:
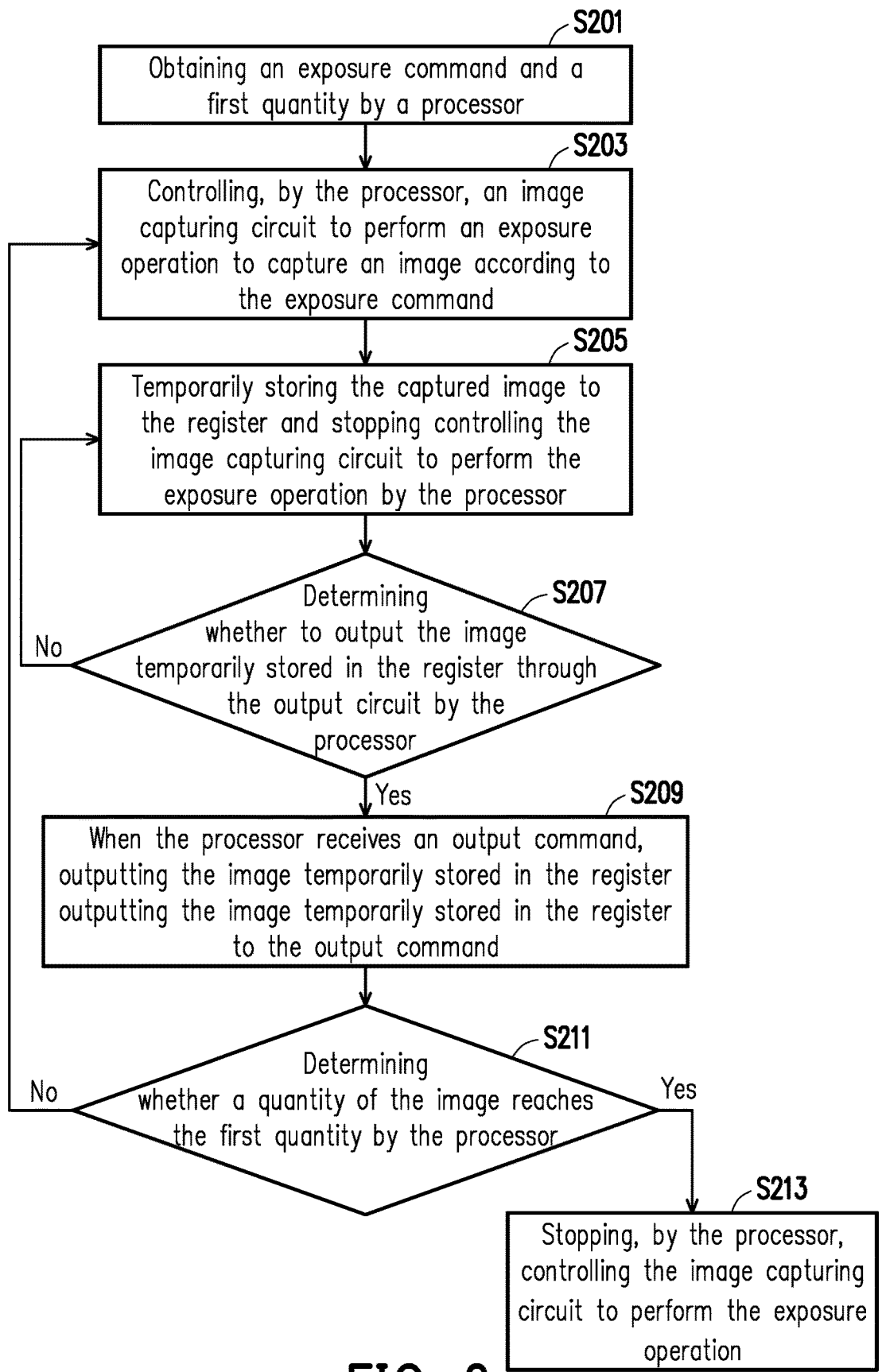
FIG. 2 is a flowchart illustrating an exposure method according to a first embodiment of the invention.

FIG. 2 is a flowchart illustrating an exposure method according to a first embodiment of the invention.

Referring to FIG. 1 and FIG. 2 together, in this embodiment, the processor 20 can obtain an exposure command and a first quantity input (or given) by the user (a step S201). Here, the first quantity refers to the number of images to be captured. In an embodiment, the first quantity is included in the exposure command. However, in another embodiment, the register 24 can pre-obtain the first quantity input by the user, and pre-store the first quantity to the register 24 for the processor 20 to access.

After receiving the exposure command, the processor 20 controls the image capturing circuit 22 to perform an exposure operation to capture an image according to the exposure command (a step S203). Next, the processor 20 temporarily stores the captured image to the register 24, and stops controlling the image capturing circuit 22 to perform the exposure operation (i.e., stops controlling the image capturing circuit 22 to capture the image) (a step S205). Subsequently, the processor 20 determines whether to output the image temporarily stored in the register 24 through the output circuit 26 (a step S207).

When the processor 20 receives an output command given by the user or receives the output command from the outside, the processor 20 outputs the image temporarily stored in the register 24 through the output circuit 26 according to the output command (a step S209). For example, the image temporarily stored in the register 24 may be output through the output circuit 26 to display the image on a monitor, or the image temporarily stored in the register 24 may be output by the output circuit 26 to another device. Further, in the step S207, the processor 20 does not output the image temporarily stored in the register 24 through the output circuit 26 when the processor 20 does not receive the output command, and the image capturing circuit 22 is maintained in the state of stopping the exposure operation when a remained capacity of the register 24 is not sufficient for storing the next image (i.e., returning to the step S205).

After the processor 20 outputs the image temporarily stored in the register 24 through the output circuit 26 according to the output command (i.e., the step S209), the processor 20 determines whether a quantity of the image captured after the exposure operation is performed by the image capturing circuit 22 reaches the first quantity (a step S211). If the quantity of the image captured after the exposure operation is performed by the image capturing circuit 22 does not reach the first quantity, the flow of FIG. 2 returns to the step S203 so the processor 20 can control the image capturing circuit 22 to perform the exposure operation to capture the image again and perform the step S205 to S211 again. However, in the step S211, if the processor 20 determines that the quantity of the image captured after the exposure operation is performed by the image capturing circuit 22 reaches the first quantity, the processor 20 stops controlling the image capturing circuit 22 to perform the exposure operation (a step S213).

By the above method, the first embodiment of this invention can set up the number of images to be obtained by the image capturing circuit 22, so as to prevent the image capturing circuit 22 from capturing too many images. In addition, after the image is captured by the image capturing circuit 22, the first embodiment of the invention directly stops the exposure operation without immediately capturing the next image. Instead, the image capturing circuit 22 only captures the next image only after the previously captured image is output. By doing so, the image capturing circuit 22 may prevent the electronic device from unnecessary power consumption due to the exposure operation being continuously performed (or the image being continuously captured).

Second Embodiment

Figure 3:
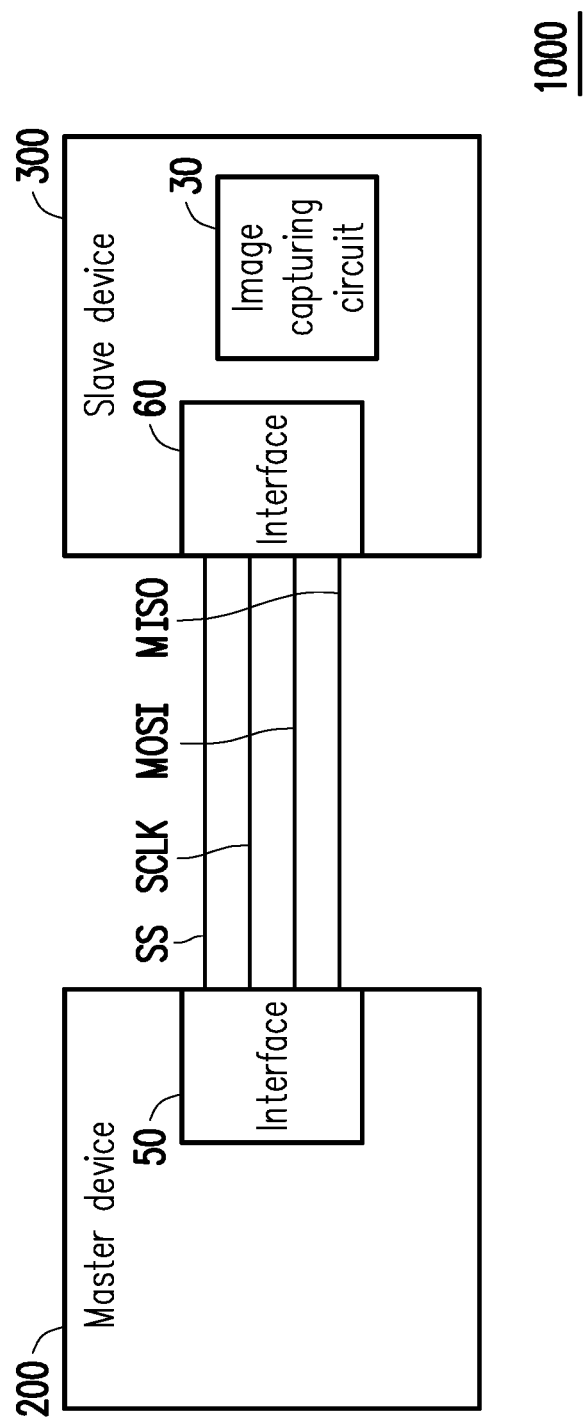
FIG. 3 is a schematic diagram illustrating a master-slave system according to an embodiment of the invention.

FIG. 3 is a schematic diagram illustrating a master-slave system according to an embodiment of the invention.

With reference to FIG. 3, a master-slave system 1000 includes a master device 200 and a slave device 300. Each of the master device 200 and the slave device 300 may include, for example, a processor (not illustrated) or a storage circuit (not illustrated). In the master device 200 and the slave device 300, the storage circuit may be coupled to the processor. Here, the master device 200 and the slave device 300 may be, for example, electronic devices such as cell phones, tablet computers, notebook computers or the like, but not limited thereto. Further, in other embodiments, the master device 200 and the slave device 300 may also include more of other devices. In particular, in other embodiments, the master device 200 and the slave device 300 may also be disposed in the same device. It should be noted that, although FIG. 3 only shows that one main device 200 is connected to one slave device 300, the invention is not limited thereto. In other embodiments, one master device 200 may be connected multiple slave devices 300.

The processor may be a device similar to the processor 20 in the first embodiment, which is not repeated hereinafter. The storage circuit may be a device similar to the storage circuit of the electronic device 100, which is not repeated hereinafter. Further, in this exemplary embodiment, the slave device 300 further includes an image capturing circuit 30 coupled to the processor of the slave device 300. The image capturing circuit 30 may be a device similar to the image capturing circuit 22 in the first embodiment, which is not repeated hereinafter.

In this embodiment, the master device 200 has an interface 50 (a.k.a. a first interface), and the slave device 300 has an interface 60 (a.k.a. a second interface). Among them, the first interface and the second interface are electrically connected to each other so the master device 200 can conduct a data transmission with the slave device 300. In this exemplary embodiment, the interface 50 and the interface 60 are serial peripheral Interfaces (SPI). Here, one serial peripheral interface has a select slave (SS) pin, a serial clock (SCLK) pin, a master output slave input (MOSI) pin and a master input slave output (MISO) pin. When the interface 50 is electrically connected to the interface 60, the SS pin of the master device 200 is electrically connected to the SS pin of the slave device 300; the SCLK pin of the master device 200 is electrically connected to the SCLK pin of the slave device 300; the MOSI pin of the master device 200 is electrically connected to the MOSI pin of the slave device 300; and the MISO pin of the master device 200 is electrically connected to the MISO pin of the slave device 300.

In this exemplary embodiment, the storage circuits of the master device 200 and the slave device 300 are stored with a plurality of program code segments. After being installed, the program code segments will be executed by the processor of each of the master device 200 and the slave device 300. For example, the storage circuits of the master device 200 and the slave device 300 include a plurality of modules, and operations of the master-slave system 1000 are respectively executed by these modules. Here, each of the modules is composed of one or more program code segments. However, the invention is not limited in this regard. Each of the operations may also be implemented in other hardware manners. In addition, the processors of the master device 200 and the slave device 300 may also be used to conduct a data transmission between the master device 200 and the slave device 300.

Figure 4:
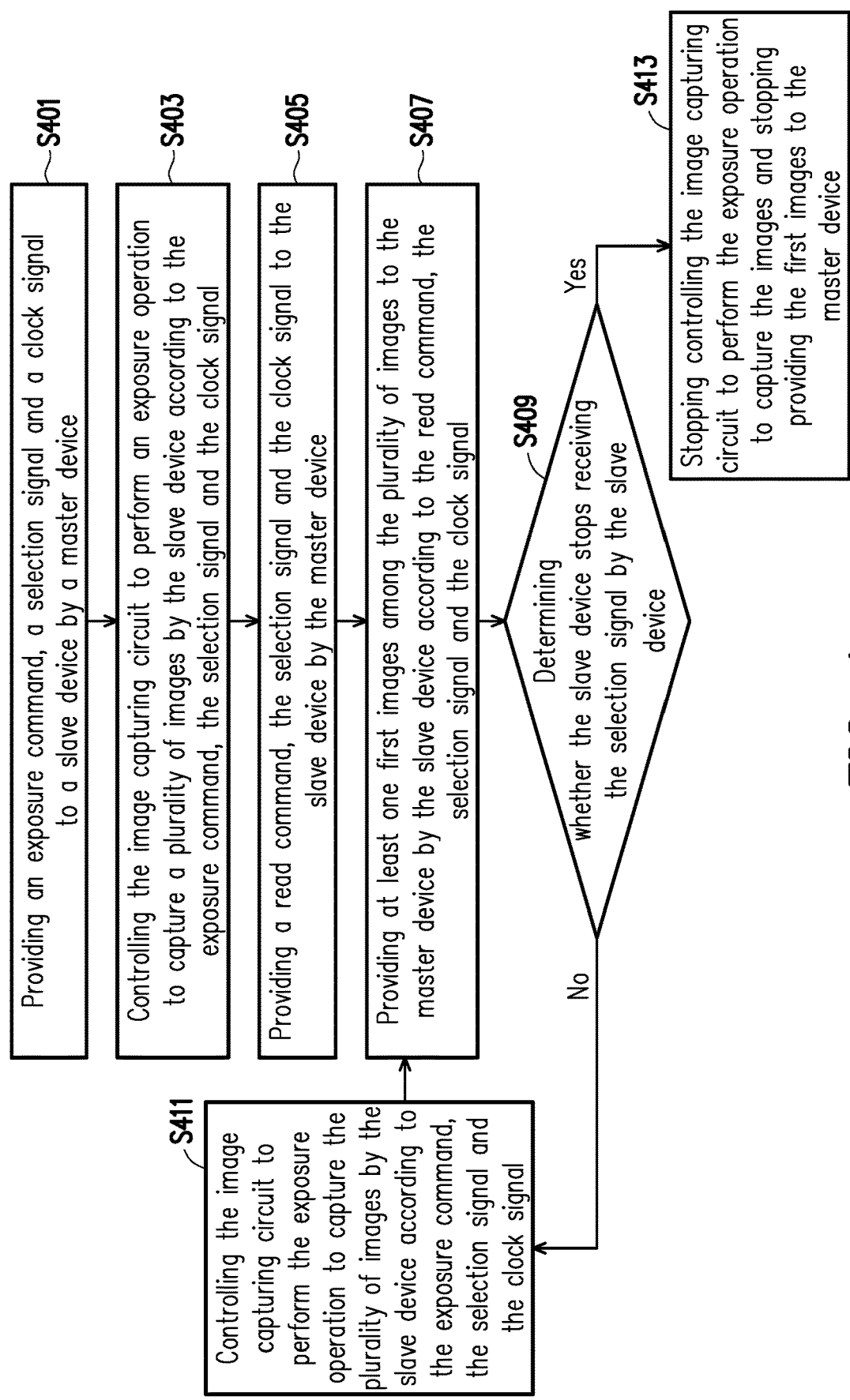
FIG. 4 is a flowchart illustrating an exposure method according to a second embodiment of the invention.
Figure 5:
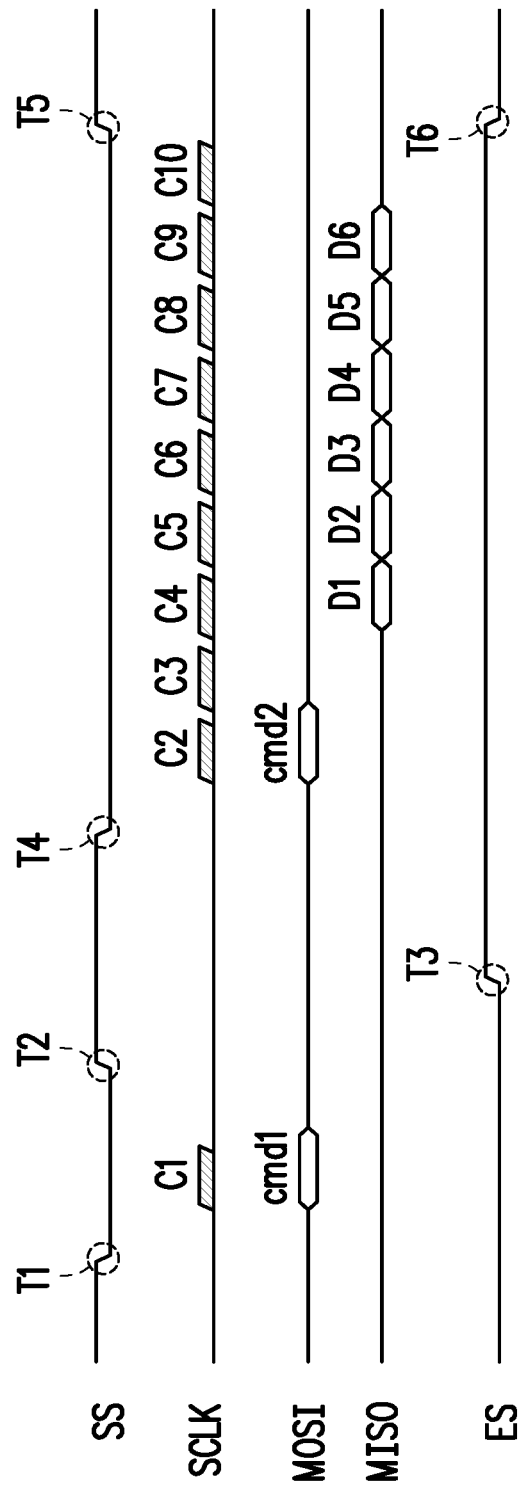
FIG. 5 is a schematic diagram illustrating a SPI signal transmission according to an embodiment of the invention.

FIG. 4 is a flowchart illustrating an exposure method according to a second embodiment of the invention. FIG. 5 is a schematic diagram illustrating a SPI signal transmission according to an embodiment of the invention.

Referring to FIG. 4 and FIG. 5 together, first of all, as shown by FIG. 5, the master device 200 provides a selection signal through the SS pin, provides a clock signal through the SCLK pin, and provides an exposure command cmd1 through the MOSI pin to the slave device 300 (a step S401). As shown by FIG. 5, the selection signal is, for example, a signal originally at high potential in the SS pin being adjusted to a signal at low potential, which is used to allow the slave device 300 to known that the signal has been selected by the master device 200. In FIG. 5, the low potential signal is located between a time point T1 and a time point T2. Further, the clock signal of step S401 includes a clock cycle C1.

Then, the slave device 300 controls the image capturing circuit 30 to perform an exposure operation to capture a plurality of images according to the exposure command cmd1, the selection signal and the clock signal of the step S401 (a step S403). For example, at a time point T3, the slave device 300 adjusts an exposure state ES of the image capturing circuit 30 from low potential to high potential according to the exposure command cmd1, the selection signal and the clock signal. Accordingly, an exposure function of the image capturing circuit 30 may be enabled to make the image capturing circuit 30 start the exposure operation to capture the images. The captured images may be stored in a register (not illustrated) of the slave device 300.

Subsequently, the master device 200 then provides the selection signal through the SS pin, provides the clock signal through the SCLK pin, and provides a read command cmd2 through MOSI pin to the slave device 300 (a step S405). As shown by FIG. 5, the selection signal is, for example, a signal originally at high potential in the SS pin at a time point T4 being adjusted to a signal at low potential, which is used to allow the slave device 300 to known that the signal has been selected by the master device 200. In FIG. 5, the low potential signal is located between the time point T4 and a time point T5. Further, the master device 200 continuously provides the clock signal including clock cycles C2 to C10 to the slave device 300.

Subsequently, the salve device 300 provides images D1 to D6 (collectively known as first images) among the plurality of images captured by the image capturing unit 30 through the MISO pin to the master device 200 according to the read command cmd2, the selection signal and the clock signal (a step S407). Also, in the process of providing the first images, the salve device 300 determines whether the slave device 300 stops receiving the selection signal (a step S409). In other words, the slave device 300 determines whether the signal at low potential in the SS pin is restored (or adjusted) to high potential.

If the slave device 300 determines that the signal in the SS pin constantly stays at low potential, the slave device 300 then determines that the slave device 300 continuously receives the selection signal. In this case, the slave device 300 controls the image capturing circuit 30 to continuously perform the exposure operation to capture the plurality of images according to the exposure command cm1, the selection signal and the clock signal (a step S411) and continuously provide the captured images to the master device 200 (i.e., returning to the step S407).

Nonetheless, in the process of providing the first images, when the slave device 300 determines that the signal in the SS pin is adjusted from low potential to high potential (e.g., at the time point T5), the slave device 300 determines that the slave device 300 stops receiving the selection signal. In this case, the slave device 300 stops performing the step of controlling the image capturing circuit 30 to perform the exposure operation and stops the step of providing the first images to the master device 200 (a step S413). Here, the step of stopping controlling the image capturing circuit 30 to perform the exposure to capture the images is to, for example, adjust the exposure state ES of the image capturing circuit 30 from high potential to low potential at a time point T6. Accordingly, the exposure function of the image capturing circuit 30 may be turned off so the image capturing circuit 30 can stop performing the exposure operation and stop capturing the images. In addition, the step of stopping providing the first images to the master 200 is to, for example, stop the slave device 300 from providing the images through the MISO pin to the master device 200.

By the above method, the second embodiment of the invention can allow the slave device 300 to determine the timing for turning on the exposure function of the image capturing circuit 30 or the timing for turning off the exposure function of the image capturing circuit 30 according to the selection signal given by the master device 200, so as to prevent the power consumption due to unnecessary exposure operation performed by the image capturing circuit 30 of the slave device 300.

In summary, the exposure method, the electronic device and the master-slave system of the invention can effectively control the timing for the exposure operation of the image capturing circuit, so as to prevent capturing too many images due to unnecessary exposure operation and effectively reduce the power consumption of the device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic device, wherein the electronic device is a slave device and adapted to electrically connect to a master device external to the electronic device, and the electronic device comprises:
    an image capturing circuit;
    a processor, coupled to the image capturing circui; and
    a register, coupled to the processor wherein
    the processor obtains one exposure command and a first quantity provided by the master device,
    the processor controls the image capturing circuit to perform one non-continuous exposure operation to capture a plutality of images according to the one exposure command, and temporarily stores the one or more plutality of images into the register,
    the processor determines whether a quantity of the plutality of images reaches the first quantity,
    when the quantity of the plutality of images does not reach the first quantity, the processor performs the operation of controlling the image capturing circuit to perform the one non-continuous exposure operation; and
    when the quantity of the plutality of images reaches the first quantity, the processor stops controlling the image capturing circuit to perform the one non-continuous exposure operation,
    wherein the processor determines whether to receive an output command provided by the master device to output at least one of the one of more plutality of images temporarily stored in the register to the master device according to the output command,
    wherein during the one non-continuous exposure operation, the processor determines whether a remained capacity of the register is not sufficient for storing a next image to temporarily stop the one non-continuous exposure operation until the output command is received so that the register outputs previously images to release the remained capacity of the register.

2. The electronic device according to claim 1, wherein the one exposure command comprises the first quantity.

3. The electronic device according to claim 1, wherein before the operation of obtaining the one exposure command and the first quantity, the register obtains the first quantity and stores the first quantity.

4. The electronic device according to claim 1, wherein the electronic device further comprises:
    an output circuit, coupled to the processor, wherein after the operation of controlling the image capturing circuit to perform the one non-continuous exposure operation to capture the plutality of images,
    the processor temporarily stores the plutality of images to the register and stops controlling the image capturing circuit to perform the one non-continuous exposure operation,
    the processor determines whether to output the at least one of the one or plutality of images temporarily stored in the register through the output circuit,
    when the processor receives the output command and the quantity of the one plutality of images does not reach the first quantity, the processor outputs the plutality of images temporarily stored in the register through the output circuit according to the output command and performs the operation of controlling the image capturing circuit to perform the one non-continuous exposure operation again, and
    when the processor receives the output command and the quantity of the plutality of images reaches the first quantity, the processor outputs the plutality of images temporarily stored in the register through the output circuit according to the output command and stops controlling the image capturing circuit to perform the one non-continuous exposure operation again.

5. An exposure method for an electronic device, wherein the electronic device is a slave device and adapted to electrically connect to a master device external to the electronic device, and the electronic device comprises an image capturing circuit, a processor and a register, the method comprising:
    obtaining, by the processor, one exposure command and a first quantity provided by the master device;
    controlling, by the processor, the image capturing circuit to perform one non-continuous exposure operation to capture plutality of images according to the one exposure command;
    temporarily storing the plutality of images to the register;
    determining whether a quantity of the plutality of images reaches the first quantity by the processor;
    when the quantity of the plutality of images does not reach the first quantity, performing, by the processor, the step of controlling the image capturing circuit to perform the one non-continuous exposure operation again;

when the quantity of the plutality of images reaches the first quantity, stopping, by the processor, controlling the image capturing circuit to perform the one non-continuous exposure operation; and determining, by the processor, whether to receive an output command provided by the master device to output at least one of the more plutality of images temporarily stored in the register to the master device according to the output command;

during the one non-continuous exposure operation, determining, by the processor, whether a remained capacity of the register is not sufficient for storing a next image to temporarily stop the one non-continuous exposure operation until the output command is received so that the register outputs previously images to release the remained capacity of the register.

6. The exposure method according to claim 5, wherein the one exposure command comprises the first quantity.

7. The exposure method according to claim 5, wherein before the step of obtaining the one exposure command and the first quantity, the method further comprises:
   obtaining the first quantity and storing the first quantity by the register.

8. The exposure method according to claim 5, wherein the electronic device further comprises an output circuit, wherein after the step of controlling the image capturing circuit to perform the one non-continuous exposure operation, the method further comprises:
   temporarily storing the plutality of images to the register and stopping controlling the image capturing circuit to perform the one non-continuous exposure operation by the processor;
   determining whether to output the plutality of images temporarily stored in the register through the output circuit by the processor;
   when the processor receives the output command and the quantity of the plutality of images does not reach the first quantity, outputting the plutality of images temporarily stored in the register through the output circuit according to the output command and performing the step of controlling the image capturing circuit to perform the one non-continuous exposure operation again by the processor, and
   when the processor receives the output command and the quantity of the plutality of images reaches the first quantity, outputting the plutality of images temporarily stored in the register through the output circuit according to the output command and stopping controlling the image capturing circuit to perform the one non-continuous exposure operation again by the processor.

* * * * *